US012696666B2

(12) United States Patent
Kim et al.

(10) Patent No.: US 12,696,666 B2
(45) Date of Patent: Jul. 28, 2026

(54) DISPLAY APPARATUS INCLUDING CONDUCTIVE LAYER HAVING THROUGH-PATTERN

(71) Applicant: Samsung Display Co., Ltd., Yongin-si (KR)

(72) Inventors: Younggu Kim, Yongin-si (KR); Sunghan Kim, Yongin-si (KR); Duckjong Suh, Yongin-si (KR); Bongsung Seo, Yongin-si (KR); Seunghee Lee, Yongin-si (KR); Baekkyun Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 416 days.

(21) Appl. No.: 18/314,689

(22) Filed: May 9, 2023

(65) Prior Publication Data

US 2024/0074290 A1     Feb. 29, 2024

(30) Foreign Application Priority Data

Aug. 29, 2022     (KR) ........................ 10-2022-0108714

(51) Int. Cl.
*H10K 59/80* (2023.01)
*H10K 71/10* (2023.01)
*H10K 102/00* (2023.01)

(52) U.S. Cl.
CPC ........... *H10K 59/873* (2023.02); *H10K 71/10* (2023.02); *H10K 2102/351* (2023.02)

(58) Field of Classification Search
CPC .. H10K 59/873; H10K 59/875; H10K 59/352; H10K 59/353; H10K 59/805;
(Continued)

(56) References Cited

U.S. PATENT DOCUMENTS 10,761,328 B2    9/2020    Hu
10,871,649 B2    12/2020    Simmonds
(Continued)

FOREIGN PATENT DOCUMENTS

EP          1463129 A2 *  9/2004    ........... H10W 40/28
KR    10-2011-0061067 A    6/2011
(Continued)

OTHER PUBLICATIONS

Kyungnam Kang et al., "Nanoslot metasurface design and characterization for enhanced organic light-emitting diodes", Scientific Reports, Apr. 29, 2021, pp. 1-12, vol. 11, Article 9232, Springer Nature.

(Continued)

*Primary Examiner* — Ida M Soward

(74) *Attorney, Agent, or Firm* — Womble Bond Dickinson (US) LLP

(57)                    ABSTRACT

A display apparatus may include a substrate, a plurality of pixel electrodes on the substrate, an emission layer above each of the plurality of pixel electrodes, an opposite electrode above the emission layer to correspond to the plurality of pixel electrodes, wherein the opposite electrode is a single body, a first passivation layer on the opposite electrode and having a thickness less than the size of a wavelength of visible light generated from the emission layer, and a conductive layer on the first passivation layer and including a through-pattern having a preset shape.

12 Claims, 12 Drawing Sheets

(58) Field of Classification Search
CPC .. H10K 59/8792; H10K 50/844; H10K 50/11;
H10K 50/81; H10K 50/52; H10K 50/85
See application file for complete search history.

(56) References Cited

U.S. PATENT DOCUMENTS

| | | | |
|---|---|---|---|
| 11,061,179 B2 | 7/2021 | Hu | |
| 11,069,751 B2 | 7/2021 | Kim et al. | |
| 2010/0072483 A1* | 3/2010 | Bae | H10K 10/82 |
| | | | 257/E21.414 |
| 2012/0299031 A1* | 11/2012 | Shiratori | H10K 59/876 |
| | | | 257/89 |
| 2016/0049443 A1* | 2/2016 | Kim | H10K 71/621 |
| | | | 257/91 |
| 2016/0204347 A1* | 7/2016 | Kim | H10K 71/00 |
| | | | 438/26 |
| 2017/0271429 A1* | 9/2017 | Kim | H10K 59/35 |
| 2019/0271894 A1* | 9/2019 | Kang | H10K 59/879 |
| 2020/0135703 A1 | 4/2020 | Ahmed et al. | |
| 2020/0220102 A1 | 7/2020 | Kang | |

| | | | |
|---|---|---|---|
| 2021/0028395 A1 | 1/2021 | Kim et al. | |
| 2021/0359078 A1* | 11/2021 | Kim | H10K 59/38 |
| 2022/0165983 A1 | 5/2022 | Ha et al. | |

FOREIGN PATENT DOCUMENTS

| | | |
|---|---|---|
| KR | 10-2020-0018797 A | 2/2020 |
| KR | 10-2020-0050517 A | 5/2020 |
| KR | 10-2021-0011560 A | 2/2021 |
| KR | 10-2022-0070114 A | 5/2022 |

OTHER PUBLICATIONS

Won-Jae Joo et al., "Metasurface-driven OLED displays beyond 10,000 pixels per inch", Science, Oct. 23, 2020, pp. 459-463, vol. 370, American Association for the Advancement of Science.
Qingyang Yue et al., "Enhancing the Out-Coupling Efficiency of Organic Light-Emitting Diodes Using Two-Dimensional Periodic Nanostructures", Advances in Materials Science and Engineering, 2012, pp. 1-9, vol. 2012, Article 985762, Hindawi Publishing Corporation.

* cited by examiner

FIG. 3

| Layer | | WVTR ($g/m^2$ day) | T (%) |
|---|---|---|---|
| ALD_$Al_2O_3$ | 10nm | $4*10^{-2}$ | > 95% |
| | 30nm | $8*10^{-3}$ | |
| | 50nm | $7*10^{-4}$ | |
| ALD_$TiO_2$ | 5nm | $3*10^{-3}$ | > 95% |
| | 10nm | $9*10^{-4}$ | < 90% |
| | 30nm | $3*10^{-4}$ | |
| Mixed Layer ($Al_2O_3$ @$TiO_2$ 5nm) | 10nm | $5*10^{-3}$ | > 95% |
| | 30nm | $2*10^{-4}$ | |
| | 60nm | $<5*10^{-5}$ | |

DISPLAY APPARATUS INCLUDING CONDUCTIVE LAYER HAVING THROUGH-PATTERN

CROSS-REFERENCE TO RELATED APPLICATION

This application claims priority to and the benefit of Korean Patent Application No. 10-2022-0108714, filed on Aug. 29, 2022, in the Korean Intellectual Property Office, the disclosure of which is incorporated by reference herein in its entirety.

BACKGROUND

1. Field

Embodiments of the disclosure relate to a display apparatus and a method of manufacturing the same, and for example, to a display apparatus and a method of manufacturing the same, which may improve light efficiency degradation caused by a surface plasmon generated on a cathode electrode.

2. Description of the Related Art

Organic light-emitting devices (OLEDs) utilized in display apparatuses may be display devices in which holes supplied from an anode and electrons supplied from a cathode combine in an organic emission layer formed between the anode and the cathode to emit light to form an image.

OLEDs are widely utilized due to their excellent or suitable display characteristics, such as a wide viewing angle, a high response speed, a small thickness, a low manufacturing cost, and a high contrast ratio.

OLEDs utilized in display apparatuses may be classified into a bottom-emission structure and a top-emission structure. In the top-emission structure, light generated from an organic emission layer is emitted to the outside through a cathode electrode. In this regard, the OLEDs have a problem in that light efficiency is reduced due to a plasmon generated on the surface of the cathode electrode.

SUMMARY

Aspects of embodiments are directed toward a display apparatus and a method of manufacturing the same, which may improve light efficiency degradation caused by a surface plasmon generated on a cathode electrode. However, the embodiments are only examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus may include a substrate, a plurality of pixel electrodes above the substrate, an emission layer above each of the plurality of pixel electrodes, an opposite electrode above the emission layer to correspond to the plurality of pixel electrodes, wherein the opposite electrode is a single body, a first passivation layer on the opposite electrode and having a thickness less than a size of a wavelength of visible light generated from the emission layer, and a conductive layer on the first passivation layer and including a through-pattern having a preset shape.

According to one or more embodiments, the thickness of the first passivation layer may be in a range of about 10 nm (e.g., 10 nm or more) to about 300 nm (e.g., 300 nm or less).

According to one or more embodiments, the first passivation layer may include a first sub-layer on the opposite electrode and including a first oxide.

According to one or more embodiments, the first sub-layer may include a single-atomic layer on the opposite electrode.

According to one or more embodiments, the first passivation layer may further include a second sub-layer on the first sub-layer and including a second oxide.

According to one or more embodiments, the first oxide may be different from the second oxide.

According to one or more embodiments, the first oxide may be one of titanium oxide and aluminum oxide, and the second oxide may be the other one of titanium oxide and aluminum oxide.

According to one or more embodiments, the conductive layer may include a metal material having a negative dielectric function.

According to one or more embodiments, the metal material may include at least one of Au, Ag, Al, Cu, or Ni.

According to one or more embodiments, the display apparatus may further include a dielectric material filling the through-pattern.

According to one or more embodiments, a thickness of the conductive layer may be about 10 nm or more and about 50 nm or less.

According to one or more embodiments, the display apparatus may further include a second passivation layer on the conductive layer, covering the conductive layer, and having a water vapor transmission rate (WVTR) less than a WVTR of the first passivation layer.

According to one or more embodiments, the first passivation layer may be formed by atomic layer deposition (ALD).

According to one or more embodiments, a method of manufacturing a display apparatus may include forming a plurality of pixel electrodes above a substrate, forming an emission layer above the plurality of pixel electrodes, forming an opposite electrode above the emission layer, forming, on the opposite electrode by utilizing atomic layer deposition (ALD), a first passivation layer having a thickness less than a wavelength of visible light generated from the emission layer, forming a conductive layer on the first passivation layer, and forming a through-pattern having a preset shape in the conductive layer.

According to one or more embodiments, the thickness of the first passivation layer may be in a range of about 10 nm (e.g., 10 nm or more) to about 300 nm (e.g., 300 nm or less).

According to one or more embodiments, the forming of the first passivation layer may include forming, on the opposite electrode, a first sub-layer including a first oxide.

According to one or more embodiments, the forming of the first passivation layer may further include forming, on the first sub-layer, a second sub-layer including a second oxide.

According to one or more embodiments, the conductive layer may include a metal material having a negative dielectric function.

According to one or more embodiments, the metal material may include at least one of Au, Ag, Al, Cu, or Ni.

According to one or more embodiments, the method of manufacturing the display apparatus may further include filling the preset-shaped through-pattern with a dielectric material.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 3 is a table for comparing the performances according to the type or kind of a first passivation layer of FIG. 1 according to an embodiment;

DETAILED DESCRIPTION

Figure 1:
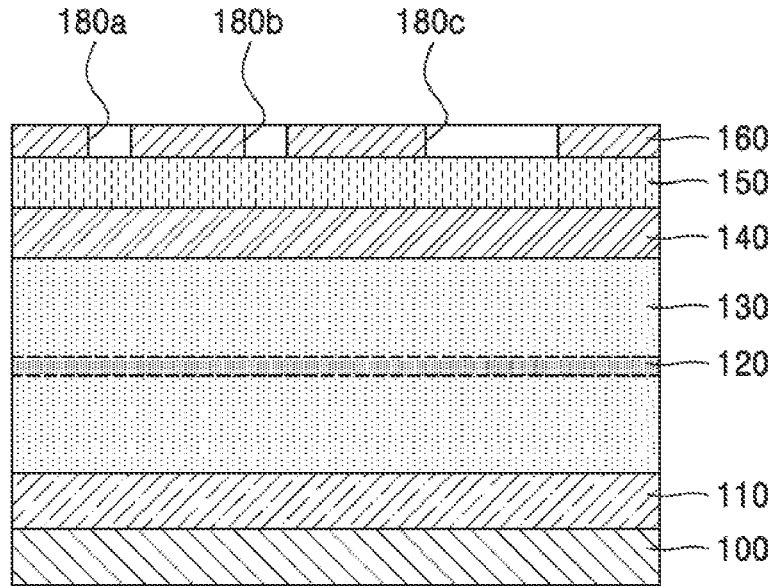
FIG. 1 is a schematic cross-sectional view of a portion of a display apparatus according to an embodiment.

Reference will now be made in more detail to embodiments, examples of which are illustrated in the accompanying drawings, wherein like reference numerals refer to like elements throughout, and duplicative descriptions thereof may not be provided the present specification. In this regard, the present embodiments may have different forms and should not be construed as being limited to the descriptions set forth herein. Accordingly, the embodiments are merely described below, by referring to the drawings, to explain aspects of the present description. As utilized herein, the term "and/or", "or", etc., may include any and all combinations of one or more of the associated listed items. Throughout the disclosure, the expression "at least one of a, b or c", "at least one of a, b, and/or c", "at least one selected from among a, b, and c", "at least one among a, b, or c", etc., (three or more item case), indicates only a, only b, only c, both (e.g., simultaneously) a and b, both (e.g., simultaneously) a and c, both (e.g., simultaneously) b and c, all of a, b, and c, or variations thereof.

In the present specification, "A and/or B", "A or B", etc., may represent A or B, or A and B. The expression "at least one of A and B", "one of A and B", "one selected from A and B", etc., (two item case) indicates only A, only B, both (e.g., simultaneously) A and B, or variations thereof.

One or more suitable modifications may be applied to the present embodiments, and particular embodiments of the disclosure will be illustrated in the drawings and described in the detailed description section. The effect and features of the present embodiments, and a method to achieve the same, will be clearer referring to the detailed descriptions below with the drawings. However, the present disclosure may be implemented in one or more suitable forms, not by being limited to the embodiments presented below.

Hereinafter, embodiments of the present disclosure will be described in more detail with reference to the accompanying drawings, and in the description with reference to the drawings, the same or corresponding components are indicated by the same reference numerals and redundant descriptions thereof may not be provided.

In the following embodiment, it will be understood that when a component such as a layer, film, region, or plate is referred to as being "formed on" another layer, film, region, or plate, it can be directly or indirectly formed on the other layer, film, region, or plate. For example, for example, intervening layers, films, regions, or plates may be present. Sizes of components in the drawings may be exaggerated or reduced for convenience of explanation. In other words, because sizes and thicknesses of components in the drawings are arbitrarily illustrated for convenience of explanation, the following embodiments are not limited thereto.

In the following embodiment, the x-axis, the y-axis, and the z-axis are not limited to three axes of the rectangular coordinate system, and may be interpreted in a broader sense. For example, the x-axis, the y-axis, and the z-axis may be substantially perpendicular to one another, or may represent different directions that are not substantially perpendicular to one another.

In this specification, when an element (or region, layer, part, etc.) is referred to as being "on", "connected to", or "coupled to", or "adjacent to" another element, it refers to that it may be directly placed on/connected to/coupled to other components, or one or more third components may be arranged between them. That is, it should be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

Spatially relative terms, such as "beneath", "below", "lower", "downward", "above", "upper", "left", "right", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As used herein, the term "substantially," "about," and similar terms are used as terms of approximation and not as terms of degree, and are intended to account for the inherent deviations in measured or calculated values that would be recognized by those of ordinary skill in the art. "About" or "substantially", as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" or "substantially" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display apparatus and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Hereinafter, a display apparatus according to an embodiment is described in more detail.

FIG. 1 is a schematic cross-sectional view of a portion of a display apparatus according to an embodiment.

As shown in FIG. 1, the display apparatus according to an embodiment may include a substrate 100, a pixel electrode 110, an emission layer 120, an opposite electrode 140, a first passivation layer 150, and a conductive layer 160. An intermediate layer 130 is arranged between the pixel electrode 110 and the opposite electrode 140, and the intermediate layer 130 may include the emission layer 120. The intermediate layer 130 is described in more detail.

The substrate 100 may include one or more suitable flexible or bendable materials. For example, the substrate 100 may include glass, a metal, or polymer resin. When the substrate 100 includes polymer resin, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multilayer structure including two layers including polymer resin, and a barrier layer arranged between the two layers and including an inorganic material (for example, silicon oxide, silicon nitride, or silicon oxynitride), and one or more suitable modifications may be made.

A plurality of pixel electrodes 110 may be disposed above the substrate 100. A display device may be disposed on each of the plurality of pixel electrodes 110. An organic light-emitting device (OLED) may be utilized as the display device. In other words, the OLED may be disposed on, for example, the plurality of pixel electrodes 110. The plurality of pixel electrodes 110 may include a transmissive conductive layer including a transmissive conductive oxide, such as ITO, $In_2O_3$, or IZO, and a reflective layer including a metal, such as Al or Ag.

For example, the plurality of pixel electrodes 110 may have a three-layer structure of ITO/Ag/ITO. In some embodiments, other components may be arranged between the plurality of pixel electrodes 110 and the substrate 100. The pixel electrode 110 may be utilized as an anode electrode in a display device.

The emission layer 120 may be disposed above each of the plurality of pixel electrodes 110. In more detail, the intermediate layer 130 may include the emission layer 120, and the intermediate layer 130 may be disposed on each of the plurality of pixel electrodes 110.

The intermediate layer 130 may include a hole injection layer, a hole transport layer, an emission layer, an electron transport layer, and/or an electron injection layer.

The opposite electrode 140 may be disposed above the emission layer 120. The opposite electrode 140 may correspond to the plurality of pixel electrodes 110, and may be formed as a single body. In some embodiments, the opposite electrode 140 may include a transmissive conductive layer including a transmissive conductive oxide, such as ITO, $In_2O_3$, or IZO. The opposite electrode 140 may be utilized as a cathode electrode.

The first passivation layer 150 may be disposed on the opposite electrode 140. The first passivation layer 150 may have a thickness less than the size of a wavelength of visible light generated from the emission layer 120. The thickness of the first passivation layer 150 may be in a range of about 10 nm (e.g., 10 nm or more) to about 300 nm (e.g., 300 nm or less), for example, in a range of about 10 nm to about 300 nm. In a case where the thickness of the first passivation layer 150 is less than about 10 nm, when the conductive layer 160 is formed, oxygen and moisture penetrate into the OLED, thereby significantly shortening the device lifespan. When the thickness of the first passivation layer 150 is greater than about 300 nm, transmittance of the first passivation layer 150 may decrease, thereby adversely affecting image quality. Performance results according to the thickness of the first passivation layer 150 is described with reference to FIG. 3 (in more detail).

The first passivation layer 150 may prevent or reduce penetration of moisture into the display device or the OLED when the conductive layer 160 is formed. The first passivation layer 150 may include an inorganic material, and in more detail, the inorganic material may be an inorganic oxide. The first passivation layer 150 may include at least one inorganic material selected from the group including $Al_2O_3$, $TiO_2$, $HfO_2$, and $SnO_2$.

In a case where the thickness of the first passivation layer 150 is less than about 10 nm, when the conductive layer 160 is formed on the first passivation layer 150, moisture is more likely to penetrate the display device or the OLED. When the thickness of the first passivation layer 150 is greater than about 300 nm, an interaction between the conductive layer 160 and the opposite electrode 140 may be weakened as described. In some embodiments, the first passivation layer 150 may not only function to protect the OLED, but also serve to help efficient emission of light generated from the OLED.

The first passivation layer 150 may be formed by atomic layer deposition (ALD). The ALD may be carried out in such a manner that the pressure in a chamber is set to atmospheric pressure or reduced pressure, source gases for reaction are sequentially introduced into the chamber, and then the sequence of the gas introduction is repeated.

For example, two or more types (kinds) of source gases are sequentially supplied to the chamber by switching respective switching valves. For example, a first source gas is introduced. Inert gas (for example, argon or nitrogen) and/or the like is introduced concurrently (e.g., simultaneously) with or after the introduction of the first source gas so that the inert gas (for example, argon or nitrogen) is not mixed with the source gases, and then a second source gas is introduced. When the first source gas and the inert gas are introduced at the same time, the inert gas acts as a carrier gas, and the inert gas may be also introduced concurrently (e.g., simultaneously) with the introduction of the second source gas.

In some embodiments, the first source gas may be exhausted by vacuum evacuation instead of the introduction of the inert gas, and then the second source gas may be introduced. The first source gas is adsorbed on the surface of the substrate 100 to form a first single-atomic layer, and then the second source gas is introduced to react with the first single-atomic layer, and as a result, a second single-atomic layer is stacked over the first single-atomic layer. The sequence of the gas introduction is repeated multiple times until a desired or suitable thickness is obtained, whereby a thin film with excellent or suitable step coverage may be formed. The thickness of the thin film may be adjusted by the number of repetition times of the sequence of the gas introduction. Therefore, ALD may precisely adjust the thickness of a thin film.

For example, when an aluminum oxide film is formed utilizing ALD, two types (kinds) of gases, that is, $H_2O$ as an oxidizer and a source gas obtained by vaporizing liquid containing a solvent and an aluminum precursor compound (for example, trimethylaluminum (TMA, $Al(CH_3)_3$), may be utilized.

The conductive layer 160 may be disposed on the first passivation layer 150. The conductive layer 160 may include a first through-pattern 180a, a second through-pattern 180b, and a third through-pattern 180c having a preset shape. The conductive layer 160 may include a metal material having a negative dielectric function (ε'<0), and the metal material having a negative dielectric function may include at least one of gold (Au), silver (Ag), aluminum (Al), copper (Cu), or nickel (Ni).

The conductive layer 160 may have an electric field generated by an interaction with an electric field generated by the opposite electrode 140. In other words, when a dielectric material filling the preset-shaped first to third through-patterns 180a, 180b, and 180c of the conductive layer 160 is affected by the electric field generated by the opposite electrode 140, the conductive layer 160 may generate an electric field according to the electric field generated by the opposite electrode 140. Light trapped by a surface plasmon generated on the opposite electrode 140 may be emitted to the outside by the electric field generated by the conductive layer 160. In other words, the conductive layer 160 may be configured to emit, to the outside, light that is trapped by a surface plasmon generated on the opposite electrode 140 through an interaction with the opposite electrode 140, thereby improving light efficiency of the display apparatus.

The thickness of the conductive layer 160 may be less than the thickness of the first passivation layer 150. The thickness of the conductive layer 160 may be in a range of about 10 nm (e.g., 10 nm or more) to about 300 nm (e.g., 300 nm or less), for example, in a range of about 10 nm to about 50 nm. When the conductive layer 160 is thinner than about 10 nm, it may be difficult to form a substantially uniform film. When the conductive layer 160 is thicker than about 50 nm, transmittance may decrease, thereby adversely affecting image quality, and the efficiency of emitting light that is trapped by a surface plasmon on the opposite electrode 140 to the outside may decrease. As a result, the light efficiency of the display apparatus may be adversely affected.

Furthermore, the conductive layer 160 may reduce reflection of external light. The conductive layer 160 may reduce reflectance of the display apparatus by trapping external light rather than light generated from the emission layer 120. An electric field is generated by the preset-shaped first to third through-patterns 180a, 180b, and 180c, and the conductive layer 160 may trap external light utilizing the generated electric field. As a result, the conductive layer 160 may reduce reflectance of the display apparatus, and the display apparatus according to the present embodiment may not include (e.g., may exclude) a separate polarizing plate due to the reflectance reduced by the conductive layer 160.

The conductive layer 160 may be a two-dimensional metasurface including a metamaterial. The metamaterial is any material engineered to have a property that is not found in the natural world by artificially changing the arrangement and structure of a natural material. Because the conductive layer 160 includes the preset-shaped first to third through-patterns 180a, 180b, and 180c, light efficiency degradation caused by a surface plasmon on the opposite electrode 140 may be resolved, and reflectance of an external light source may be reduced. Therefore, the conductive layer 160 may be defined as a two-dimensional metasurface including a metamaterial.

As such, for an active interaction between the conductive layer 160 and the opposite electrode 140, the conductive layer 160 and the opposite electrode 140 are required to be apart from each other by an appropriate or suitable distance. The thickness of the first passivation layer 150 may be adjusted when the display apparatus is manufactured, to be apart from the conductive layer 160 and the opposite electrode 140 by an appropriate or suitable distance. For example, as the thickness of the first passivation layer 150 decreases, a distance between the conductive layer 160 and the opposite electrode 140 decreases, and as a result, an interaction between the conductive layer 160 and the opposite electrode 140 may actively occur. In some embodiments, as the thickness of the first passivation layer 150 decreases, transmittance of light may increase. In contrast, as the thickness of the first passivation layer 150 decreases, a water vapor transmission rate (WVTR) of the first passivation layer 150 may increase.

Figure 2:
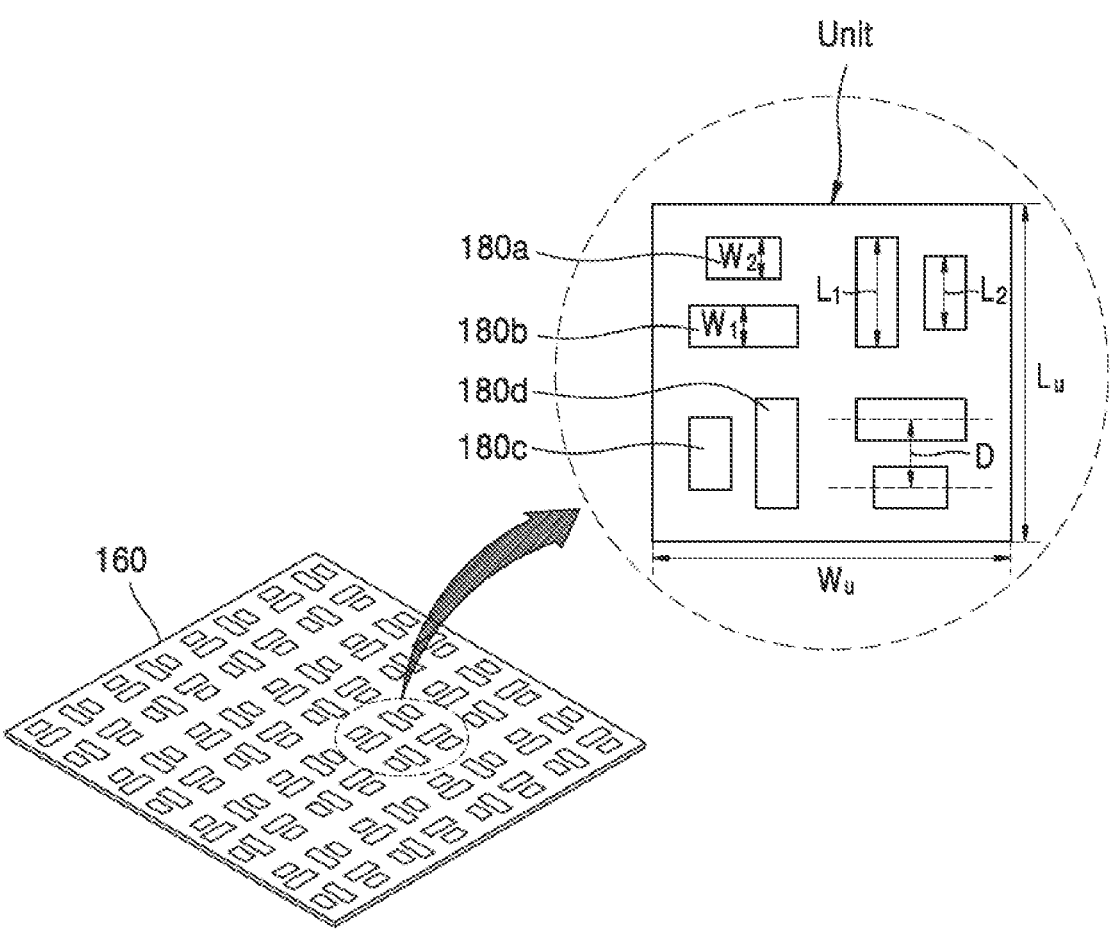
FIG. 2 is a schematic perspective view of an example of a conductive layer of FIG. 1 according to an embodiment.

FIG. 2 is a schematic perspective view of an example of a conductive layer of FIG. 1.

As shown in FIG. 2, the conductive layer 160 may include the first through-pattern 180a, the second through-pattern 180b, the third through-pattern 180c, and a fourth through-pattern 180d having the preset shape. The preset-shaped first to fourth through-patterns 180a, 180b, 180c, and 180d may include a repeating unit. In other words, the preset-shaped first to fourth through-patterns 180a, 180b, 180c, and 180d may include a plurality of units including a through hole. The length of one side of a unit may be the same as the length of another side thereof.

The inside of the preset-shaped first to fourth through-patterns 180a, 180b, 180c, and 180d may be filled with a dielectric material. In other words, the display apparatus according to the present embodiment may further include a dielectric material filling the preset-shaped first to fourth through-patterns 180a, 180b, 180c, and 180d. The dielectric material may include at least one of $SiO_2$, $CaF_2$, $MgF_2$, LiF, SiNx, SiCN, SiON, $Ta_xO_y$, TiOx $HfO_2$, or $ZrO_2$.

The unit may include a first through hole 180a and a second through hole 180b. In some embodiments, the unit may further include a plurality of through holes that are identical to the first through hole 180a and the second through hole 180b except for the arrangement.

Figure 11:
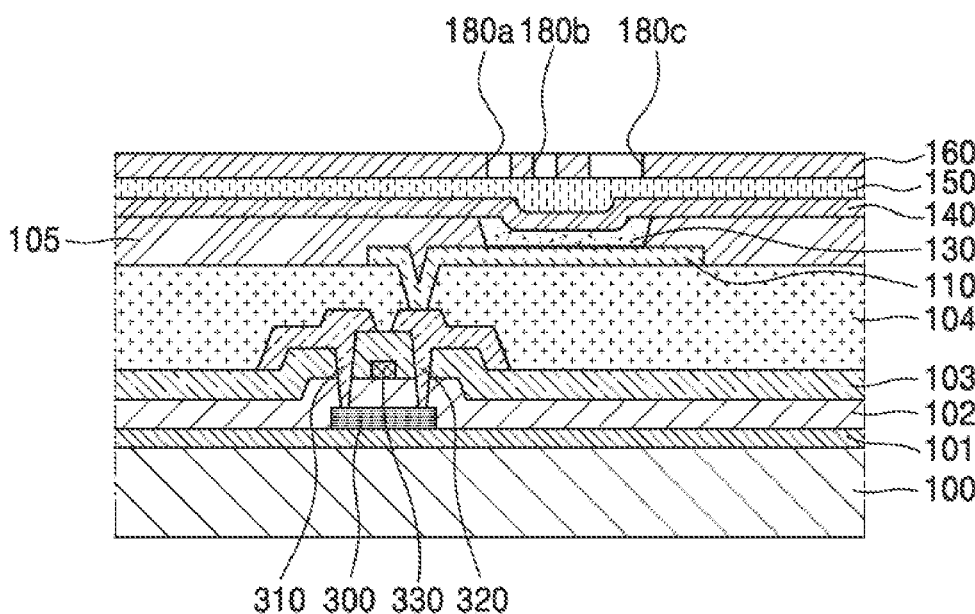
FIG. 11 is a cross-sectional view of an example of implementing a display apparatus according to an embodiment.
Figure 12:
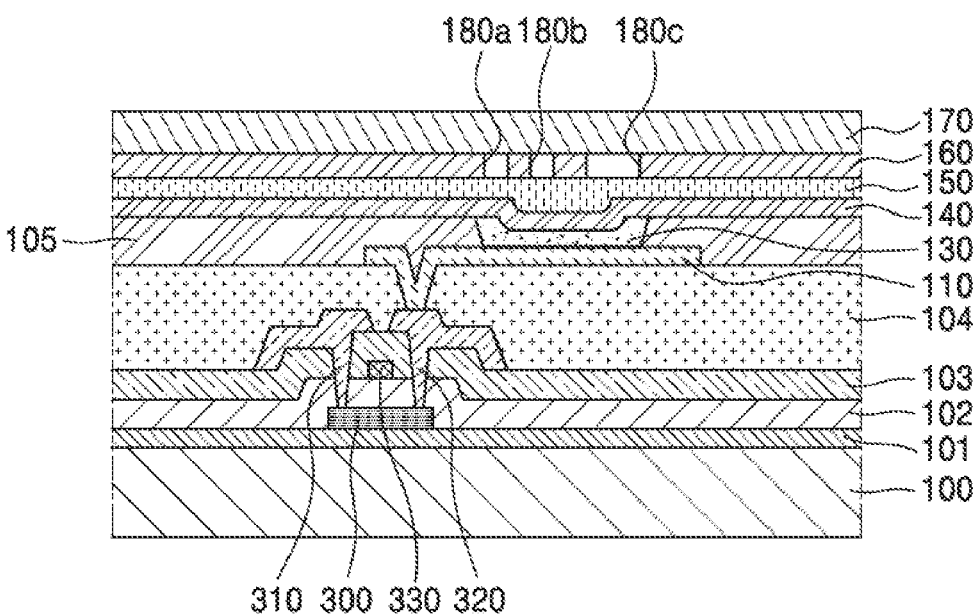
FIG. 12 is a cross-sectional view of an example of implementing a display apparatus according to an embodiment.

The unit may be disposed on an opening of a pixel-defining film 105 (see FIGS. 11 and 12). In some embodiments, the unit may also be disposed on an area outside the opening of the pixel-defining film 105. The unit disposed on the opening may be a component for emitting, to the outside, light trapped by the opposite electrode 140 disposed on the opening.

The unit disposed on the area outside the opening may be a component for emitting, to the outside, side light or internally reflected light trapped by the opposite electrode 140 disposed on the area outside the opening.

In the unit, the third through hole 180c may correspond to the first through hole 180a, and the fourth through hole 180d may correspond to the second through hole 180b. In some embodiments, the unit may further include another through hole corresponding to the first through hole 180a and another through hole corresponding to the second through hole 180b.

The length of the first through hole 180a may be less than the length of the second through hole 180b. The width of the first through hole 180a may be the same as the width of the second through hole 180b, or may be the same as the width of the second through hole 180b within an error range.

A distance between the central axis of the first through hole 180a in a longitudinal direction and the central axis of the second through hole 180b in a longitudinal direction may be the same as a distance between the central axis of the third through hole 180c in a longitudinal direction and the central axis of the fourth through hole 180d in a longitudinal direction, or may be same as a distance between the central axis of the third through hole 180c in a longitudinal direction and the central axis of the fourth through hole 180d in a longitudinal direction within an error range. A distance between the central axis of the first through hole 180a in a longitudinal direction and the central axis of the second through hole 180b in a longitudinal direction may be less than the size of a wavelength of visible light generated from the emission layer 120, and for example, may be in a range of about 10% (e.g., 10% or more) to about 25% (e.g., 25% or less) of the size of a wavelength of visible light generated from the emission layer 120. For example, when the size of a wavelength of visible light generated from the emission layer 120 is about 625 nm, a distance between the central axis of the first through hole 180a in a longitudinal direction and the central axis of the second through hole 180b in a longitudinal direction may be about 125 nm.

A length $W_u$ of one side of the unit may be less than the size of a wavelength of visible light generated from the emission layer 120. For example, when the unit has a square shape and the size of a wavelength of visible light generated from the emission layer 120 is about 625 nm, the length $W_u$ of one side of the unit may be about 500 nm. When the length $W_u$ of one side of the unit is greater than the size of a wavelength of visible light generated from the emission layer 120, an interaction between the conductive layer 160 and the opposite electrode 140 may not occur well.

When a distance between the central axis of the first through hole 180a in a longitudinal direction and the central axis of the second through hole 180b in a longitudinal direction is less than about 10% of the size of a wavelength of visible light generated from the emission layer 120, intensity of an electric field generated within the conductive layer 160 may decrease. In this case, a sufficient interaction between the conductive layer 160 and the opposite electrode 140 may not be achieved. In some embodiments, as the intensity of the electric field of the conductive layer 160 decreases, reflected light removal efficiency of the conductive layer 160 may also decrease.

In contrast, when a distance between the central axis of the first through hole 180a in a longitudinal direction and the central axis of the second through hole 180b in a longitudinal direction is greater than about 25% of the size of a wavelength of visible light generated from the emission layer 120, intensity of an electric field generated within the conductive layer 160 may decrease. In this case, a sufficient interaction between the conductive layer 160 and the opposite electrode 140 may not be achieved. In some embodiments, as the intensity of the electric field of the conductive layer 160 decreases, reflected light removal efficiency of the conductive layer 160 may also decrease.

The first through hole 180a and the second through hole 180b may be arranged parallel to each other in a first direction. The third through hole 180c and the fourth through hole 180d may be arranged parallel to each other in a second direction. At this time, the first direction and the second direction may intersect each other. A first-first direction from the second through hole 180b to the first through hole 180a may intersect with a second-first direction from the fourth through hole 180d to the third through hole 180c. In some embodiments, the second-first direction may be a direction rotated by 90 degrees counterclockwise with respect to the first-first direction.

Likewise, another through hole corresponding to the first through hole 180a and another through hole corresponding to the second through hole 180b may be arranged parallel to each other in a third direction. The third direction may be the same as the first direction or the second direction. A third-first direction from another through hole corresponding to the second through hole 180b to another through hole corresponding to the first through hole 180a may be a direction rotated by 90 degrees clockwise with respect to the first-first direction or a direction rotated by 90 degrees counterclockwise with respect to the second-first direction.

The first to fourth through-patterns 180a, 180b, 180c, and 180d shown in FIG. 2 are merely examples for convenience of explanation, and the display apparatus according to the present embodiment may not be limited thereto.

FIG. 3 is a table for comparing the performances according to the type or kind of a first passivation layer of FIG. 1.

As shown in FIG. 3, the first passivation layer 150 may include a first sub-layer disposed on the opposite electrode 140 and including a first oxide. The first oxide may be one of titanium oxide and aluminum oxide.

The first sub-layer may include a single-atomic layer. The first sub-layer is formed utilizing ALD, and thus, may include (e.g., consist of) a single-atomic layer or may include a single-atomic layer.

In a case where the first oxide is aluminum oxide ($Al_2O_3$), when the thickness of the first sub-layer is about 10 nm to about 50 nm, transmittance (T) of the first sub-layer may be greater than about 95%. When the thickness of the first sub-layer is about 50 nm among about 10 nm, about 30 nm, and about 50 nm, the lowest WVTR is confirmed. In other words, when transmittance (T) of the first sub-layer is greater than about 95%, it may be advantageous as the thickness of the first sub-layer increases.

In a case where the first oxide is titanium oxide ($TiO_2$), when the thickness of the first sub-layer is about 5 nm, transmittance (T) of the first sub-layer is greater than about 95%. However, when the thickness of the first sub-layer is about 10 nm to about nm, transmittance (T) of the first sub-layer is less than about 90%. In some embodiments, when the thickness of the first sub-layer is about 30 nm among about 5 nm, about 10 nm, and about 30 nm, the lowest WVTR is confirmed. In other words, in order for transmittance (T) of the first sub-layer to be greater than about 95%, the thickness of the first sub-layer is required to be about 5 nm or at least less than about nm.

The first passivation layer 150 may further include a second sub-layer disposed on the first sub-layer and including a second oxide. The second sub-layer may include a single-atomic layer. The second sub-layer is formed utilizing ALD, and thus, may include (e.g., consist of) a single-atomic layer or may include a single-atomic layer.

The second oxide may be one of titanium oxide and aluminum oxide, and may be different from the first oxide. Like the first sub-layer, the second sub-layer may be formed utilizing ALD.

In a case where the thickness of the second sub-layer in which the second oxide is titanium oxide ($TiO_2$) is about 5 nm, when the thickness of the first passivation layer 150 is about 10 nm to about 60 nm, transmittance (T) of the first passivation layer 150 may be greater than about 95%. However, the thickness of the first sub-layer may be obtained by subtracting the thickness of the second sub-layer from the thickness of the first passivation layer 150.

In a case where the thickness of the second sub-layer in which the second oxide is titanium oxide ($TiO_2$) is about 5 nm, when the thickness of the first passivation layer 150 is about 60 nm among about 10 nm, about 30 nm, and about 60 nm, the lowest WVTR is confirmed. When the thickness of the first passivation layer 150 is about 60 nm, a WVTR of the first passivation layer 150 may be less than about 5*10-5. At this time, transmittance of the first passivation layer 150 may be greater than about 95%.

Generally, in order to protect an OLED from moisture and to secure the lifespan of the OLED for at least 50,000 hours, it is suitable that a WVTR of a passivation layer protecting the OLED is required to be less than about 10-6 (g/m 2 day). Accordingly, in order to protect the OLED from moisture generated in a process of forming the conductive layer 160, the first passivation layer 150 includes the first sub-layer and the second sub-layer, and when the thickness of the second sub-layer is about 5 nm, the thickness of the first passivation layer 150 may be about 60 nm.

In some embodiments, when a second passivation layer to be described is disposed on a conductive layer, the thickness of first passivation layer 150 may be relatively small. When a second passivation layer to be described is not disposed on a conductive layer, the thickness of the first passivation layer 150 may increase. In this case, the thickness of the first passivation layer 150 may be about 50 nm or more and about 300 nm or less.

Figure 4:
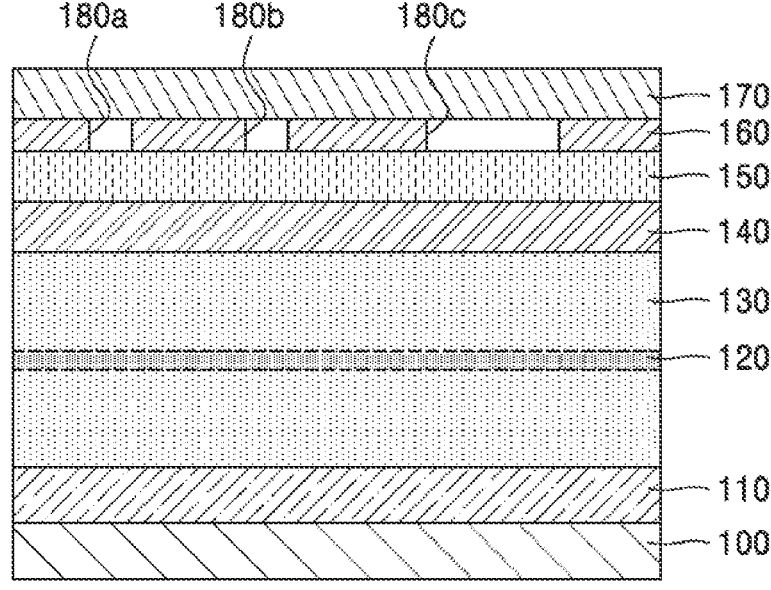
FIG. 4 is a schematic cross-sectional view of a portion of the display apparatus of FIG. 1 to which a second passivation layer is added according to an embodiment.

FIG. 4 is a schematic cross-sectional view of the display apparatus of FIG. 1 to which a second passivation layer is added.

A second passivation layer 170 may be disposed on the conductive layer 160. The second passivation layer 170 may be a thin-film evaporator (THE). The second passivation layer 170 seals an OLED. The second passivation layer 170 may include at least one inorganic film. In some embodiments, the second passivation layer 170 may include at least one organic film (hereinafter, referred to as an encapsulation organic film) and at least one encapsulation inorganic film.

The second passivation layer 170 may include only the encapsulation inorganic film. In some embodiments, the second passivation layer 170 may further include an encapsulation organic film for planarization of the encapsulation inorganic film and additional lamination of another encapsulation inorganic film. The encapsulation organic film may be arranged between two encapsulation inorganic films.

The encapsulation inorganic film protects an OLED from moisture/oxygen, and the encapsulation organic film protects an OLED from foreign substances, such as dust particles. The encapsulation inorganic film may include a silicon nitride layer, a silicon oxynitride layer, a silicon oxide layer, a titanium oxide layer, or an aluminum oxide layer, but is not particularly limited thereto.

The encapsulation organic film may include a polymer-based material. The polymer-based material may include acrylic resin, epoxy-based resin, polyimide, polyethylene, and/or the like. The encapsulation organic film may relieve internal stress of the second passivation layer 170, compensate for defects in the encapsulation inorganic film, and planarize the encapsulation inorganic film.

As such, the second passivation layer 170 may have a structure in which an encapsulation inorganic film and an encapsulation organic film are alternately stacked. As a result, a WVTR of the second passivation layer 170 may be less than a WVTR of the first passivation layer 150 including or consisting of a single-atomic layer. In other words, moisture blocking capability of the second passivation layer 170 may be greater than moisture blocking capability of the first passivation layer 150. In some embodiments, the second passivation layer 170 may be formed utilizing chemical vapor deposition (CVD) or plasma enhanced chemical vapor deposition (PECVD).

Hereinafter, a method of manufacturing a display apparatus according to an embodiment is described in more detail.

Figure 5:
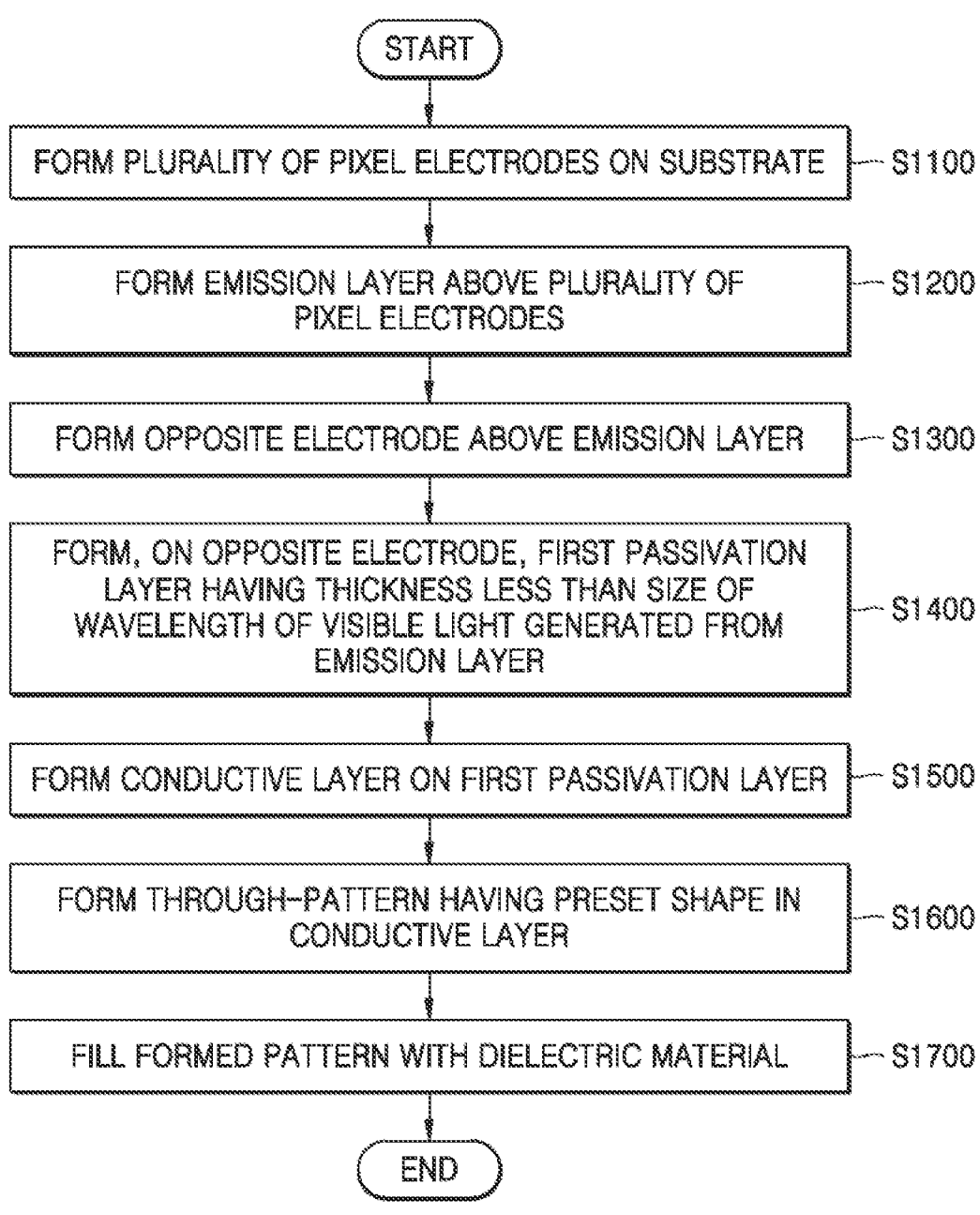
FIG. 5 is a flowchart showing a method of manufacturing a display apparatus, according to another embodiment.

FIG. 5 is a flowchart showing a method of manufacturing a display apparatus, according to another embodiment.

As shown in FIG. 5, the method of manufacturing the display apparatus (hereinafter, referred to as the manufacturing method) according to another embodiment may include forming a plurality of pixel electrodes 110 above the substrate 100 (operation S1100).

In the forming of the plurality of pixel electrodes 110 (operation S1100), a pixel electrode layer may be formed by a deposition method, such as CVD, thermal chemical vapor deposition (TCVD), PECVD, and/or the like, each utilizing a metal material. The pixel electrode layer thus formed may be patterned into the plurality of pixel electrodes 110 by a photolithography process utilizing a mask and an etching process. Here, the photolithography process may utilize a negative photoresist or a positive photoresist. The plurality of pixel electrodes 110 may include at least one metal among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), titanium (Ti), tungsten (W), or copper (Cu).

The mask may be divided into a transmission area that transmits light and a blocking area that blocks light transmission, according to light transmission rate. However, in some cases, a halftone mask and/or the like may be utilized, the mask type or kind may be variously changed, and the disclosure is not limited by the mask type or kind.

The manufacturing method according to the present embodiment may include, after forming the plurality of pixel electrodes 110, forming the emission layer 120 above the plurality of pixel electrodes 110 (operation S1200). In detail, in the manufacturing method according to the present embodiment, the intermediate layer 130 may be formed on the plurality of pixel electrodes 110. The intermediate layer 130 may include a hole injection layer, a hole transport layer, an emission layer, an electron transport layer, and/or an electron injection layer. Accordingly, in the manufacturing method according to the present embodiment, the intermediate layer 130 may include a hole injection layer, a hole transport layer, the emission layer 120, and an electron transport layer (and/or an electron injection layer), which are stacked in this stated order.

The manufacturing method according to the present embodiment may include, after forming the emission layer 120, forming the opposite electrode 140 above the emission layer 120 (operation S1300). The opposite electrode 140 may be disposed on the intermediate layer 130 and may be apart from and disposed above the emission layer 120. The opposite electrode 140 may be formed by a deposition method, such as CVD, TCVD, PECVD, and/or the like, each utilizing a metal material. The opposite electrode 140 thus formed may include at least one metal among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), titanium (Ti), tungsten (W), or copper (Cu).

The manufacturing method according to the present embodiment may include, after forming the opposite electrode 140, forming the first passivation layer 150 on the opposite electrode 140, utilizing ALD (operation S1400).

The first passivation layer 150 may have a thickness less than the size of a wavelength of visible light generated from the emission layer 120. The first passivation layer 150 may be formed utilizing ALD. The first passivation layer 150 may include a single-atomic layer, and may be formed by ALD so that a plurality of single-atomic layers are stacked.

In detail, the forming of the first passivation layer 150 on the opposite electrode 140 (operation S1400) may include forming, on the opposite electrode 140, a first sub-layer including a first oxide utilizing ALD, and forming, on the first sub-layer, a second sub-layer including a second oxide utilizing ALD. The descriptions of the ALD may each independently be the same as described above or are redundant, and thus, are not provided.

As described above, the first sub-layer may be formed on the opposite electrode 140, includes the first oxide, and may be formed to include a single-atomic layer. The first oxide may be one of titanium oxide and aluminum oxide.

The second sub-layer may be formed on the first sub-layer, includes the second oxide, and may be formed to include a single-atomic layer, like the first sub-layer. The second oxide may be one of titanium oxide and aluminum oxide, and may be different from the first oxide.

The manufacturing method according to the present embodiment may include, after forming the first passivation layer 150, forming the conductive layer 160 on the first passivation layer 150 (operation S1500), and forming a through-pattern having a preset shape in the conductive layer 160 (operation S1600).

In the forming of the conductive layer 160 (operation S1500), the conductive layer 160 may be formed by a deposition method, such as CVD, TCVD, PECVD, and/or the like, each utilizing a metal material. The metal material may include at least one metal among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), titanium (Ti), tungsten (W), or copper (Cu).

In the forming of the preset-shaped through-pattern (operation S1600), a photolithography process utilizing a mask and an etching process may be utilized. The forming of the preset-shaped through-pattern is described in more detail.

In some embodiments, the manufacturing method according to the present embodiment may further include, after forming the through-pattern, filling the formed pattern with a dielectric material (operation S1700). The filling of the through-pattern with the dielectric material is described in more detail.

FIGS. 6 to 9 are schematic cross-sectional views of the display apparatus in a process of forming a conductive layer and a through-pattern and filling the through-pattern with a dielectric material according to a time sequence of the manufacturing method of FIG. 5.

Figure 6:
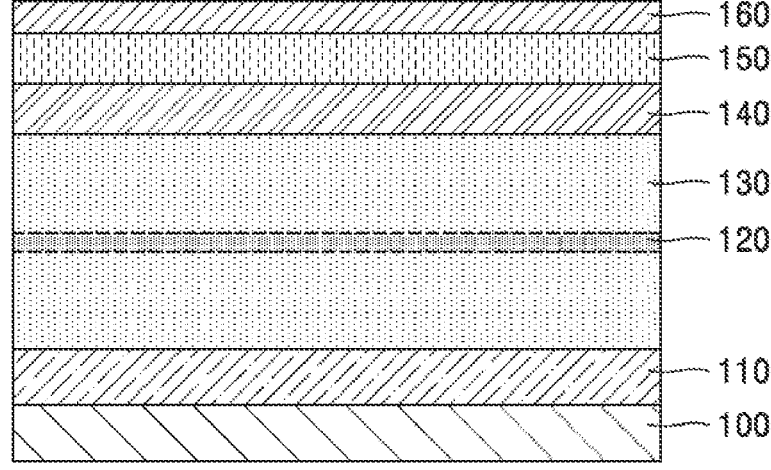
FIGS. 6-9 are schematic cross-sectional views of the display apparatus in a process of forming a conductive layer and a through-pattern and filling the through-pattern with a dielectric material according to a time sequence of the manufacturing method of FIG. 5 according to an embodiment.
Figure 7:
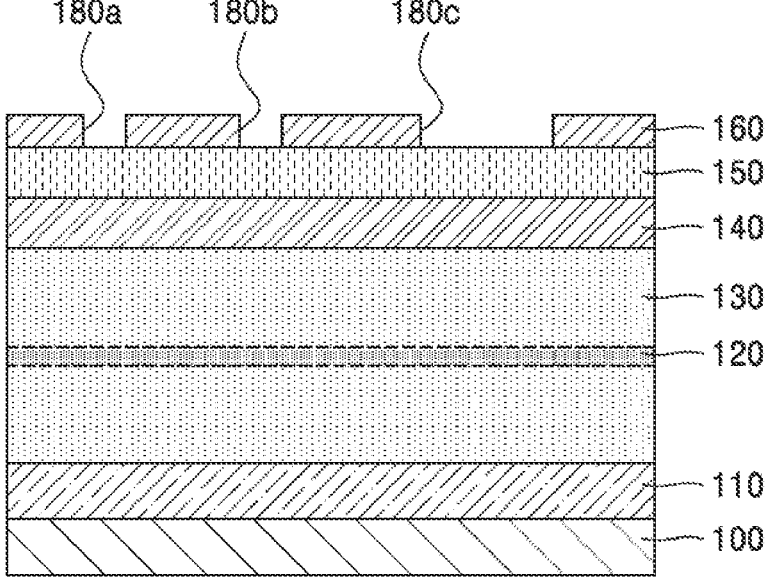

As shown in FIGS. 6 and 7, in the manufacturing method according to the present embodiment, the conductive layer 160 may be formed on the first passivation layer 150, and the preset-shaped first to third through-patterns 180a, 180b, and 180c may be formed by applying a photolithography process and an etching process to the conductive layer 160 thus formed.

Figure 8:
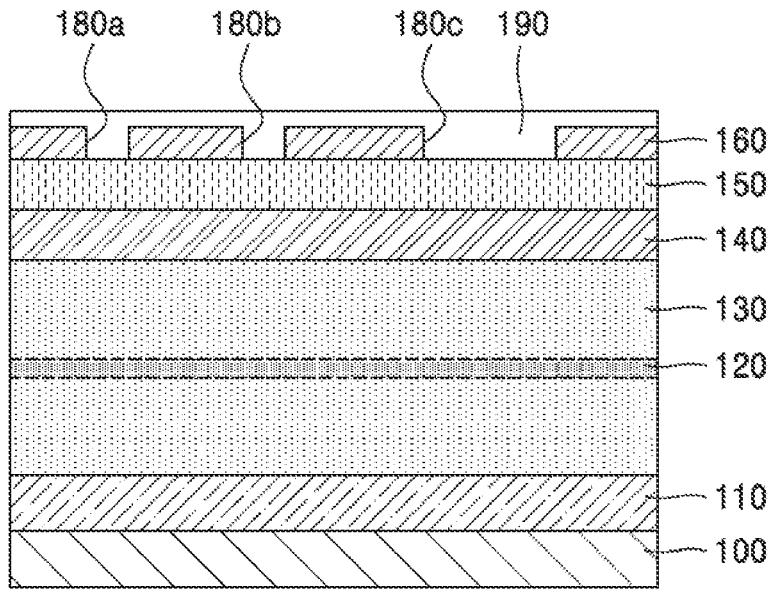
Figure 9:
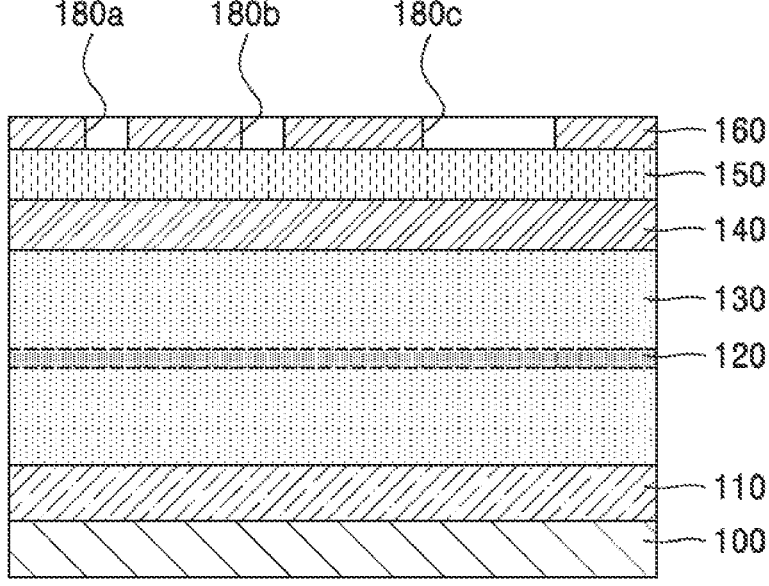

As shown in FIGS. 8 and 9, in the manufacturing method according to the present embodiment, a dielectric layer may be further formed on the conductive layer 160 in which the first to third through-patterns 180a, 180b, and 180c are formed, in order to fill the first to third through-patterns 180a, 180b, and 180c with a dielectric material. While the dielectric layer is formed, the first to third through-patterns 180a, 180b, and 180c may be filled with the dielectric material. Afterwards, the dielectric layer may be removed except for the dielectric material inside the first to third through-patterns 180a, 180b, and 180c by applying an etching process. The descriptions of the dielectric material may each independently be the same as described above or are redundant, and thus, are not provided.

Figure 10:
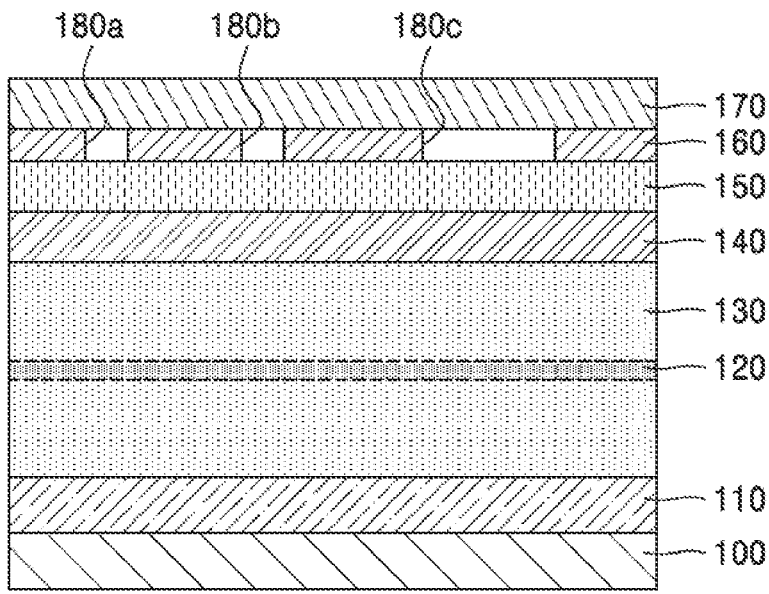
FIG. 10 is a cross-sectional view of the display apparatus in which a second passivation layer is additionally formed in the manufacturing method of FIG. 5 according to an embodiment.

FIG. 10 is a cross-sectional view of the display apparatus in which a second passivation layer is additionally formed in the manufacturing method of FIG. 5.

As shown in FIG. 10, the manufacturing method according to the present embodiment may further include, after filling the first to third through-patterns 180a, 180b, and 180c with the dielectric material, forming the second passivation layer 170 on the conductive layer 160 (operation S1700).

The second passivation layer 170 may be formed to cover the conductive layer 160 and may include an encapsulation inorganic film. In some embodiments, the second passivation layer 170 may include (e.g., consist of) only an encapsulation inorganic film or may include an encapsulation inorganic film and an encapsulation organic film.

In a case where the second passivation layer 170 includes an encapsulation inorganic film and an encapsulation organic film, in the forming of the second passivation layer 170 (operation S1700), a first encapsulation inorganic film may be formed, and a first encapsulation organic film may be formed on the first encapsulation inorganic film. In some embodiments, in the forming of the second passivation layer 170 (operation S1700), a second encapsulation inorganic film may be formed on the first encapsulation organic film. In some embodiments, in the forming of the second passivation layer 170 (operation S1700), a second encapsulation organic film may be formed on the second encapsulation inorganic film, a third encapsulation inorganic film may be formed on the second encapsulation organic film. As such, in the forming of the second passivation layer 170, the encapsulation inorganic film and the encapsulation organic film may be alternately stacked.

The encapsulation organic film may include a polymer-based material. The polymer-based material may include acrylic resin, epoxy-based resin, polyimide, polyethylene, and/or the like. The encapsulation organic film may relieve internal stress of the second passivation layer 170, compensate for defects in the encapsulation inorganic film, and planarize the encapsulation inorganic film.

Hereinafter, an example of a display apparatus according to the present embodiment is described in more detail based on the above descriptions. FIGS. 11 and 12 are examples of implementing FIGS. 1 to 4, and may be for convenience of explanation and understanding. Therefore, the disclosure is not limited thereto.

FIG. 11 is a cross-sectional view of an example of implementing a display apparatus according to an embodiment.

As shown in FIG. 11, the display apparatus according to the present embodiment may include the substrate 100, a buffer layer 101, a thin-film transistor (TFT), a gate insulating film 102, an interlayer insulating film 103, a source electrode 310, a drain electrode 320, the pixel electrode 110, the pixel-defining film 105, the intermediate layer 130, the opposite electrode 140, the first passivation layer 150, and the conductive layer 160.

The substrate 100 may include one or more suitable flexible or bendable materials, and other descriptions are omitted. The buffer layer 101 may prevent or reduce penetration of impurities through the substrate 100 and provide a flat surface on the substrate 100.

The TFT may be disposed on the buffer layer 101. The TFT may include an activation layer 300, a gate electrode 330, the source electrode 310, and the drain electrode 320.

The activation layer 300 may include an inorganic semiconductor, such as silicon or polysilicon, an organic semiconductor, or an oxide semiconductor, and may include a source region, drain region, and a channel region.

The gate insulating film 102 for insulating the activation layer 300 and the gate electrode 330 may be disposed above the activation layer 300, and the gate electrode 330 may be disposed above the gate insulating film 102.

The interlayer insulating film 103 may be disposed above the gate electrode 330. The interlayer insulating film 103 may be disposed between the gate electrode 330 and the source electrode 310 to insulate them and may be disposed between the gate electrode 330 and the drain electrode 320 to insulate them.

The source electrode 310 and the drain electrode 320 may be disposed on the interlayer insulating film 103. The interlayer insulating film 103 and the gate insulating film 102 may be formed to expose the source region and the drain region of the activation layer 300, and the source electrode 310 and the drain electrode 320 may be arranged to be in contact with the exposed source region and drain region of the activation layer 300.

The TFT may be electrically connected to a light-emitting device to drive the light-emitting device, and is protected by being covered with an insulating layer 104. The insulating layer 104 may include an inorganic insulating film, an organic insulating film, or a combination thereof. An OLED is provided on the insulating layer 104. The OLED includes the pixel electrode 110, the intermediate layer 130, and the opposite electrode 140.

The pixel electrode 110 may be disposed on the insulating layer 104. The insulating layer 104 may be arranged to expose a certain area of the drain electrode 320 without covering the entire drain electrode 320, and the pixel electrode 110 may be disposed to be connected to the exposed drain electrode 320.

The pixel-defining film 105 including an insulating material may be disposed on the pixel electrode 110. The pixel-defining film 105 exposes a certain area of the pixel electrode 110, and the intermediate layer 130 may be formed in the exposed area. The pixel-defining film 105 may be a polyimide-based or polyacrylic organic film. The pixel-defining film 105 may cover an edge of the pixel electrode 110. The opposite electrode 140 is disposed on the intermediate layer 130, and the first passivation layer 150 may be additionally formed on the opposite electrode 140. The first passivation layer 150 may be formed to cover the opposite electrode 140. The first passivation layer 150 may block or reduce moisture or oxygen that may penetrate into the OLED as the conductive layer 160 is formed, and at the same time, serve as an existing capping layer (CPL).

The conductive layer 160 is disposed on the first passivation layer 150, and the conductive layer 160 includes the preset-shaped first to third through-patterns 180a, 180b, and 180c and may be apart from the opposite electrode 140 by the thickness of the first passivation layer 150. The preset-shaped first to third through-patterns 180a, 180b, and 180c may be filled with a dielectric material, and the conductive layer 160 may generate an electric filed by the dielectric material. Reflectance of external light may be decreased by the generated electric field. In some embodiments, light trapped by a surface plasmon of the opposite electrode 140 may be emitted to the outside by the electric field generated by the conductive layer 160, and as a result, light efficiency of the display apparatus is improved.

FIG. 12 is a cross-sectional view of an example of implementing a display apparatus according to an embodiment.

The second passivation layer 170 may be disposed on the conductive layer 160. The second passivation layer 170 may protect a light-emitting device from moisture or oxygen. The second passivation layer 170 may include (e.g., consist of) an encapsulation inorganic film, or may include an encapsulation inorganic film and an encapsulation organic film. The descriptions of the second passivation layer 170 may each independently be the same as described above or are redundant, and thus are omitted.

According to an embodiment, a display apparatus and a method of manufacturing the same, which may improve light efficiency degradation caused by a surface plasmon generated on a cathode electrode, may be implemented. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A display apparatus comprising:
a substrate;
a plurality of pixel electrodes above the substrate;
an emission layer above each of the plurality of pixel electrodes;
an opposite electrode above the emission layer to correspond to the plurality of pixel electrodes, wherein the opposite electrode is a single body;
a first passivation layer on the opposite electrode and having a thickness less than a size of a wavelength of visible light generated from the emission layer; and
a conductive layer comprising a conductive material on the first passivation layer and comprising a through-pattern having a preset shape,
wherein the thickness of the first passivation layer is in a range of about 10 nm to about 300 nm.

2. The display apparatus of claim 1, wherein the first passivation layer comprises a first sub-layer on the opposite electrode and comprising a first oxide.

3. The display apparatus of claim 2, wherein the first sub-layer comprises a single-atomic layer on the opposite electrode.

4. The display apparatus of claim 3, wherein the first passivation layer further comprises a second sub-layer on the first sub-layer and comprising a second oxide.

5. The display apparatus of claim 4, wherein the first oxide is different from the second oxide.

6. The display apparatus of claim 4, wherein the first oxide is one selected from titanium oxide and aluminum oxide, and the second oxide is the other one selected from titanium oxide and aluminum oxide.

7. The display apparatus of claim 1, wherein the conductive layer comprises a metal material having a negative dielectric function.

8. The display apparatus of claim 7, wherein the metal material comprises at least one of Au, Ag, Al, Cu, or Ni.

9. The display apparatus of claim 1, further comprising a dielectric material filling the through-pattern.

10. The display apparatus of claim 1, wherein a thickness of the conductive layer is in a range of about 10 nm to about 50 nm.

11. The display apparatus of claim 1, wherein the first passivation layer is formed by atomic layer deposition (ALD).

12. A display apparatus comprising:
a substrate;
a plurality of pixel electrodes above the substrate;
an emission layer above each of the plurality of pixel electrodes;
an opposite electrode above the emission layer to correspond to the plurality of pixel electrodes, wherein the opposite electrode is a single body;
a first passivation layer on the opposite electrode and having a thickness less than a size of a wavelength of visible light generated from the emission layer; and
a conductive layer on the first passivation layer and comprising a through-pattern having a preset shape; and
a second passivation layer on the conductive layer, covering the conductive layer, and having a water vapor transmission rate (WVTR) less than a WVTR of the first passivation layer.

* * * * *